(12) United States Patent
Arnal et al.

(10) Patent No.: US 11,823,943 B2
(45) Date of Patent: Nov. 21, 2023

(54) WAFER ASSEMBLY FOR MEMS FABRICATION

(71) Applicant: Memjet Technology Limited, Dublin (IE)

(72) Inventors: Nicolas Arnal, North Ryde (AU); Troy Pasiola Quimpo, North Ryde (AU); Angus North, North Ryde (AU)

(73) Assignee: Memjet Technology Limited, Dublin (IE)

(*) Notice: Subject to any disclaimer, the term of this patent is extended or adjusted under 35 U.S.C. 154(b) by 0 days.

(21) Appl. No.: 17/739,937

(22) Filed: May 9, 2022

(65) Prior Publication Data

US 2022/0285201 A1    Sep. 8, 2022

Related U.S. Application Data

(63) Continuation of application No. 16/889,734, filed on Jun. 1, 2020, now Pat. No. 11,355,383.
(60) Provisional application No. 62/856,627, filed on Jun. 3, 2019.

(51) Int. Cl.
*H01L 21/683* (2006.01)

(52) U.S. Cl.
CPC .............................. *H01L 21/6836* (2013.01)

(58) Field of Classification Search
CPC ......... H01L 24/16; H01L 24/24; H01L 24/73; H01L 24/19; H01L 24/14
See application file for complete search history.

(56) References Cited

U.S. PATENT DOCUMENTS 6,177,187 B1 * 1/2001 Niemoller ............ B41M 7/0054
                                                        428/914

* cited by examiner

*Primary Examiner* — Brian Turner
(74) *Attorney, Agent, or Firm* — Cooley LLP

(57) ABSTRACT

A wafer assembly for use in a MEMS fabrication process. The wafer package includes: a MEMS wafer having a first side and an opposite second side; a silicone-free peel tape releasably attached to the first side of the wafer; a wafer bonding tape attached to the peel tape; and a carrier substrate releasably attached to the first wafer bonding tape.

4 Claims, 3 Drawing Sheets

WAFER ASSEMBLY FOR MEMS FABRICATION

CROSS REFERENCE TO RELATED APPLICATIONS

This application is a continuation application of U.S. application Ser. No. 16/889,734, entitled PROCESS FOR HANDLING MEMS WAFERS, filed on Jun. 1, 2020, which claims priority to and the benefit of U.S. Provisional Patent Application No. 62/856,627, entitled PROCESS FOR HANDLING MEMS WAFERS, filed on Jun. 3, 2019, the disclosure of which is incorporated herein by reference in its entirety for all purposes.

FIELD OF THE INVENTION

This invention relates to a temporary wafer bonding process for handling MEMS wafers. It has been developed primarily to minimize contamination of sensitive MEMS devices, such as inkjet devices, from contaminants originating from conventional wafer bonding tapes.

BACKGROUND OF THE INVENTION

The Applicant has developed a range of Memjet® inkjet printers as described in, for example, WO2011/143700, WO2011/143699 and WO2009/089567, the contents of which are herein incorporated by reference. Memjet® printers employ a stationary pagewide printhead in combination with a feed mechanism which feeds print media past the printhead in a single pass. Memjet® printers therefore provide much higher printing speeds than conventional scanning inkjet printers.

In order to minimize the amount of silicon, and therefore the cost of pagewide printheads, each Memjet® printhead IC is fabricated via an integrated CMOS/MEMS process to provide a high nozzle packing density. A typical Memjet® printhead IC contains 6,400 nozzle devices, which translates to 70,400 nozzle devices in an A4 printhead containing 11 Memjet® printhead ICs.

MEMS fabrication necessitates various techniques for handling silicon wafers. In order to perform MEMS processing (e.g. etching, deposition, grinding etc.) on one side of a silicon wafer, the opposite side of the wafer may be temporarily attached to a carrier substrate, such as a glass handle wafer. Temporary attachment of a silicon wafer to a carrier substrate is typically done using a wafer bonding tape. Various wafer bonding tapes will be known to the person skilled in the art, but generally fall into two categories: UV-release tapes and thermal-release tapes. UV-release tapes lose their adhesive properties on exposure to UV light, while thermal-release tapes lose their adhesive properties on exposure to heat. U.S. Pat. No. 6,846,692 and WO2008/141359 (the contents of each of which are incorporated herein by reference) describe various processes for handling MEMS wafers using UV- and thermal-release tapes. Advantageously, UV-release tapes and thermal-release tapes may be used in combination on opposite sides of a silicon wafer to provide selective removal of a first carrier substrate from a first side of the wafer, whilst retaining a second carrier substrate on the opposite side of the wafer.

Removal of a carrier substrate and wafer bonding tape is usually followed by an ashing step (e.g. using an oxygen plasma) in order to remove any organic contaminants from the MEMS silicon wafer. Contaminants are particularly problematic for MEMS inkjet devices having many thousands of inkjet nozzles. If a contaminant partially blocks an inkjet nozzle or enters a nozzle chamber and is deposited on an inkjet actuator (e.g. resistive heating element), then the performance of the device may be compromised resulting in undesirable print artifacts in resulting printheads manufactured from contaminated wafers. In some instances, print artifacts resulting from wafer contamination may be "burnt off" over several million ink ejections. However, a burn-in period is wasteful of ink and is highly undesirable for the user or the manufacturer. Therefore, minimizing contaminants throughout MEMS fabrication is crucial for maximizing wafer yields and, moreover, the quality of products resulting from the MEMS process.

Whilst oxidative ashing is effective in removing organic contaminants from silicon wafers, it cannot remove inorganic contaminants Therefore, it is desirable to provide MEMS wafer handling processes, which minimize the risk of contamination from inorganic contaminants. It is particularly desirable to identify the source of inorganic contaminants and provide a wafer handling process, suitable for MEMS inkjet printhead fabrication, which mitigates any source of inorganic contaminants.

SUMMARY OF INVENTION

In a first aspect, there is provided a process for handling MEMS wafers comprising the steps of:

(i) attaching a first carrier substrate to a first side of a MEMS wafer, the first carrier substrate being attached via a silicone-free peel tape and a first wafer bonding tape, the peel tape contacting the first side of the MEMS wafer;

(ii) performing one or more wafer processing steps on an opposite second side of the MEMS wafer;

(iii) releasing the first carrier substrate from the first side of the MEMS wafer via exposure to an energy source, the energy source selectively releasing the first wafer bonding tape from the peel tape; and (iv) peeling the peel tape away from the first side of the MEMS wafer.

The process according to the first aspect advantageously improves the quality of MEMS wafers by removing a source of contamination from inorganic particles. The present inventors have identified certain wafer bonding tapes as a significant source of inorganic particulate contamination in the fabrication of MEMS wafers. In particular, wafer bonding tapes typically contain silicone-based adhesives, which leave behind adhesive residues after being released from MEMS wafers. Conventional oxidative removal of such residues via ashing is effective in removal of organic components, but silica particles (originating from the silicone polymer) are not removed by the ashing process and have deleterious effects on MEMS devices, particularly inkjet devices containing microscopic nozzles. It is an advantage of the process according to the first aspect that it requires minimal changes to existing wafer handling processes and does not require qualification of a new wafer bonding tape.

In the process according to the first aspect, the wafer bonding tape does not directly contact the MEMS wafer, but is instead bonded via a peel tape in contact with the MEMS wafer. In this way, any adhesive residues from the wafer bonding tape are separated from the MEMS wafer by the peel tape which acts as a barrier layer. After removal of the carrier substrate, the peel tape may be simply peeled away from the MEMS wafer to leave minimal residues on the surface of the wafer. Moreover, any such residues are solely organic residues, which can be removed cleanly using a conventional oxidative ashing process without risk of contaminating MEMS devices with residual inorganic particles.

Preferably, the MEMS wafer comprises MEMS inkjet devices.

Preferably, the first side of the MEMS wafer has a plurality of inkjet nozzles.

Preferably, the first carrier substrate is comprised of glass.

Typically, the first wafer bonding tape comprises silicon. For example, the first wafer bonding tape may comprise silicon in the form of a silicone polymer.

In some embodiments, the first wafer bonding tape is a UV-release tape and the energy source is UV light. In other embodiments, the first wafer bonding tape is a thermal-release tape and the energy source is heat.

Preferably, the wafer processing steps are selected from the group consisting of: wafer grinding, etching and oxidative ashing.

Preferably, the process further comprises the step of attaching a second carrier substrate to the second side of the wafer prior to step (iii).

Preferably, the second carrier substrate is attached via a second wafer bonding tape different than the first wafer bonding tape. First example, the first and second wafer bonding tapes may be selected from the group consisting of: UV-release tape and thermal-release tape.

Preferably, the process further comprises the step of oxidatively ashing the first side of the MEMS wafer after step (iv).

In a second aspect, there is provided a wafer assembly for use in a MEMS fabrication process, the wafer package comprising:

a MEMS wafer having a first side and an opposite second side;

a peel tape releasably attached to the first side of the wafer, the peel tape being absent any silicon;

a first wafer bonding tape releasably attached to the peel tape; and a first carrier substrate attached to the first wafer bonding tape.

Preferably, the first wafer bonding tape contains silicon.

Preferably, the wafer assembly further comprises:

a second wafer bonding tape releasably attached to the second side of the wafer; and a second carrier substrate attached to the second wafer bonding tape.

Preferably, the second wafer bonding tape is different than the first wafer bonding tape.

BRIEF DESCRIPTION OF THE DRAWINGS

Embodiments of the present invention will now be described by way of example only with reference to the accompanying drawings, in which.

DETAILED DESCRIPTION OF THE INVENTION

Figure 1:
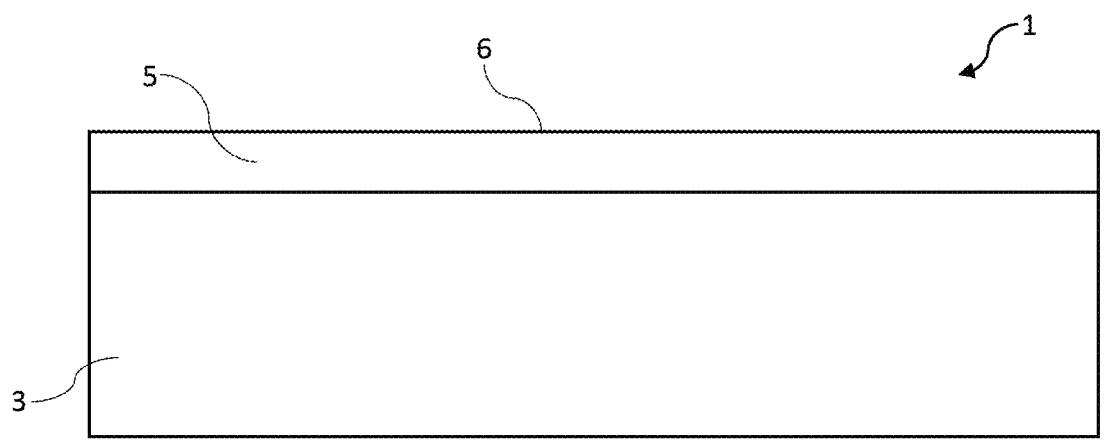
FIG. 1 is a schematic side view of a MEMS wafer.

FIGS. 1 to 6 show schematically an exemplary process for handling MEMS wafers according to the first aspect. In FIG. 1, there is a shown a MEMS wafer 1 comprising a bulk silicon substrate 3 and a frontside MEMS layer 5. The MEMS layer 5 may comprise, for example, a plurality of MEMS inkjet devices disposed on integrated circuitry with nozzles (not shown) defined in a frontside surface 6 of the MEMS wafer 1. Examples of MEMS layers comprising inkjet devices, as well as corresponding fabrication processes, are described in U.S. Pat. Nos. 9,044,945; 8,608,286; 7,246,886; and 6,755,509, the contents of each of which are incorporated herein by reference.

Figure 2:
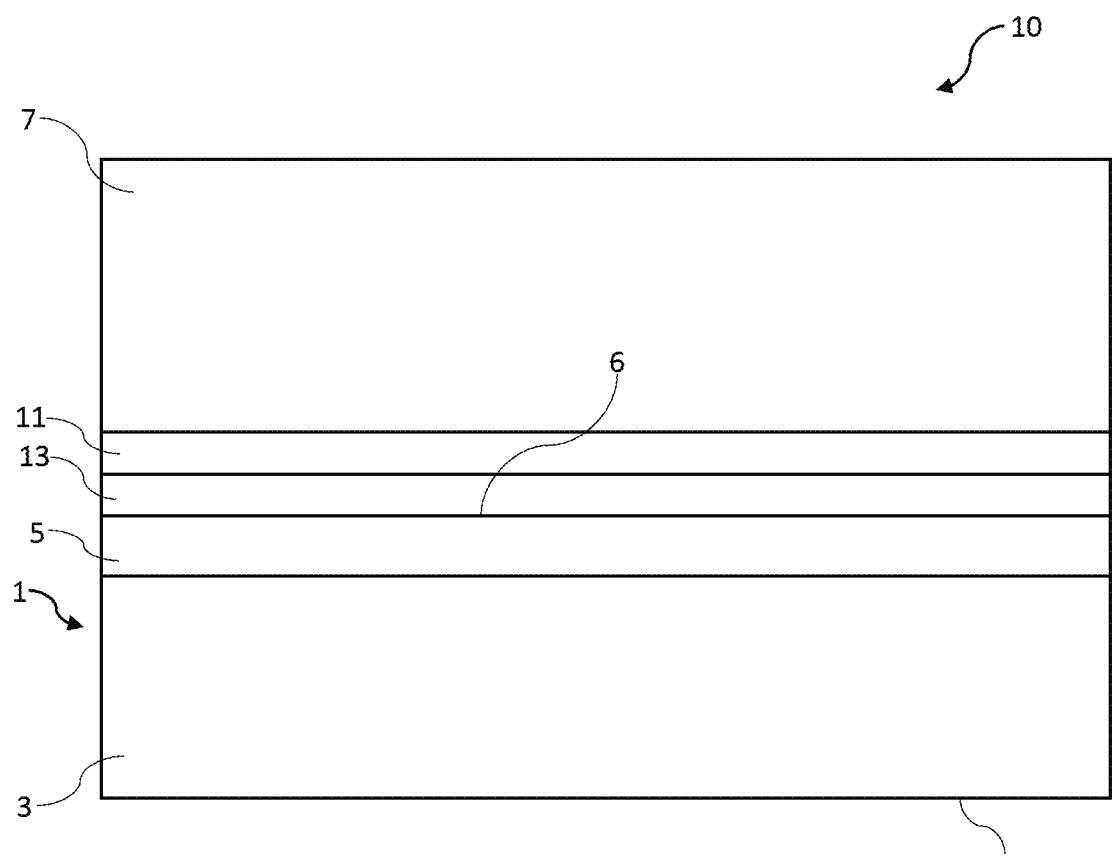
FIG. 2 shows the MEMS wafer with a frontside attached to a first carrier substrate.

FIG. 2 shows a wafer assembly 10 after attachment of a first carrier substrate 7, such as a glass handle wafer, to the frontside surface 6 of the MEMS wafer 1. The first carrier substrate 7 is attached to the frontside surface 6 via a UV-release tape 11 and a separate peel tape 13. The peel tape 13 contacts the frontside surface 6 while the UV-release tape 11 is sandwiched between the peel tape and the first carrier substrate 7.

The wafer assembly 10 may be assembled in any order. For example, the peel tape 13 may be bonded to the frontside surface 6 of the MEMS wafer 1, the UV-release tape 11 bonded to the peel tape and then the first carrier substrate 7 bonded to the UV-release tape. Alternatively, the UV-release tape 11 may be bonded to the first carrier substrate 7, the peel tape 13 bonded to the UV-release tape and then the peel tape 13 bonded to the frontside surface 6 of the MEMS wafer. Alternatively, the peel tape 13 may be bonded to the frontside surface 6 of the MEMS wafer 1, the UV-release tape 11 bonded to the first carrier substrate, and then the UV-release tape bonded to the peel tape so as to join the MEMS wafer and the first carrier substrate.

UV-release tapes are well known to those skilled in the art and are commercially available from vendors, such as Kingzom Electronic Technology Co Ltd, Nitto Denko Corporation and Furakawa Electric Group. Typically, UV-release tapes comprise at least one layer of UV-curable adhesive disposed on a base film, whereby the UV-curable adhesive loses its adhesion properties on exposure to UV light. In the embodiment shown, the UV-curable tape 11 comprises two layers of UV-curable adhesive disposed on opposite sides of a base film, whereby an upper layer of adhesive is selectively curable via exposure to UV light through the first carrier substrate 7. Typically, UV-release tapes contain silicon in the form of silicone polymers.

Peel tapes are, likewise, known to those skilled in the art. The peel tape 13 according to the present invention is selected so as to be absent any silicon. One example of a suitable peel tape for use in the present invention is Adhesive Plastic Film 1009R, available from Ultron Systems, Inc.

Figure 3:
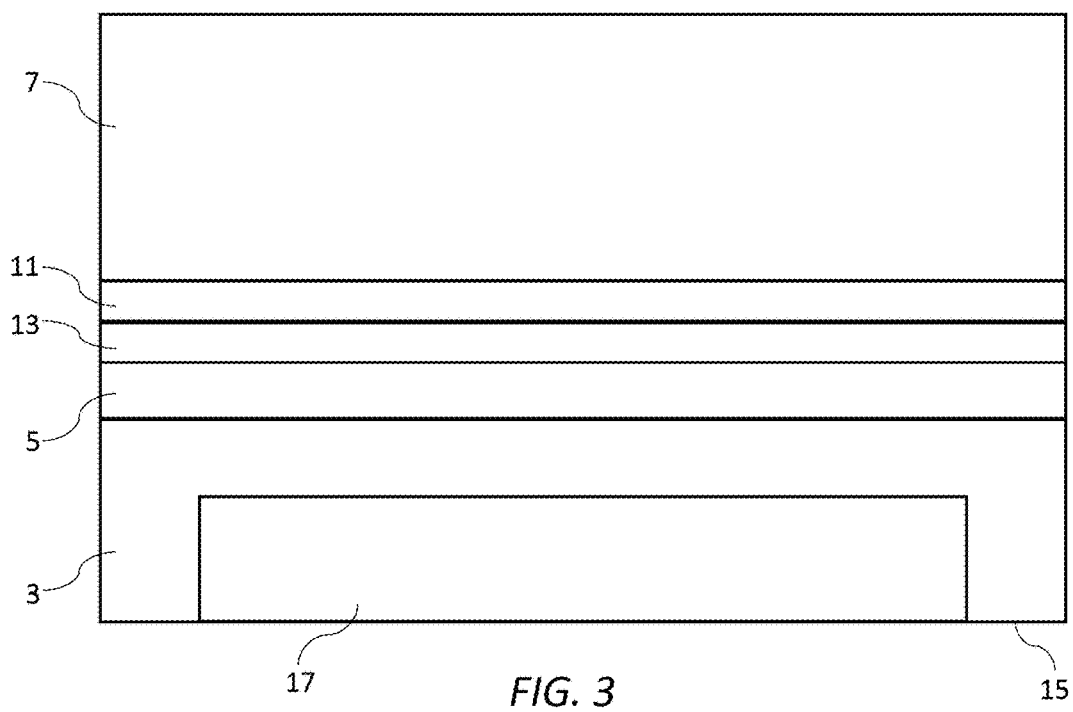
FIG. 3 shows the MEMS wafer after backside MEMS processing.

Turning to FIG. 3, after attachment of the first carrier substrate 7, a backside 15 of the MEMS wafer 1 is subjected to MEMS processing steps. The first carrier substrate 7 is used as a handle for holding the MEMS wafer 1 during backside MEMS processing. By way of example, the backside surface 15 of the silicon substrate 3 may be subjected to wafer thinning (e.g. grinding and/or plasma thinning), lithographic etching (e.g. etching of backside ink supply channels) and oxidative ashing. At this stage, backside etching of dicing streets (not shown) may be useful for singulating (or "dicing") the MEMS wafer 1 into individual dies (or "chips") attached to the first carrier substrate 7. In FIG. 3, a backside ink supply channel 17 is shown schematically corresponding to the ink supply channels described in, for example, U.S. Pat. No. 7,441,865, the contents of which are incorporated herein by reference.

Figure 4:
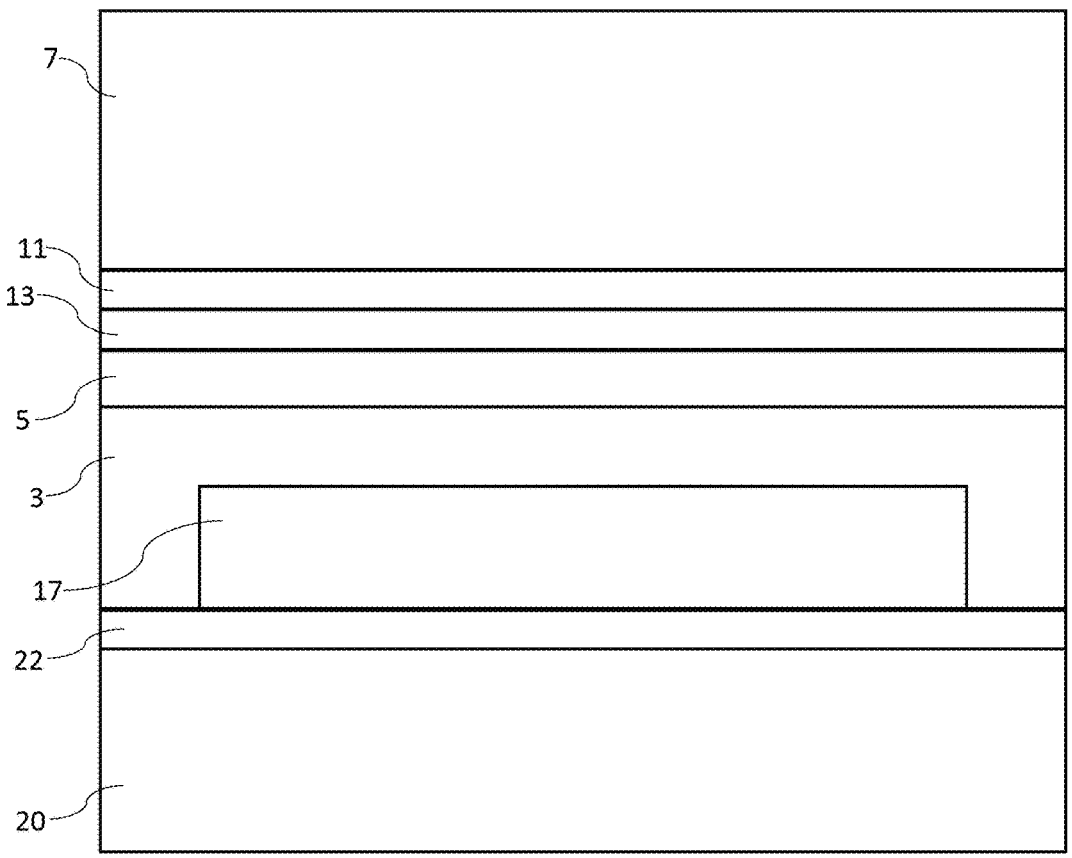
FIG. 4 shows the MEMS wafer with a backside attached to a second carrier substrate.

Following backside processing of the MEMS wafer 1, and referring now to FIG. 4, a second carrier substrate 20 (e.g.

glass handle wafer) is attached to the backside 15 of the silicon substrate 3 using a thermal-release tape 22. The use of different wafer bonding tapes on the frontside surface 6 and the backside surface 15 of the MEMS wafer 1 facilitates selective removal of the first carrier substrate 7 from the frontside whilst the second carrier substrate 20 remains attached to the backside. Thermal-release tapes will be well known to the person skilled in the art, such as Revalpha™ tape, commercially available from Nitto Denko Corporation.

Figure 5:
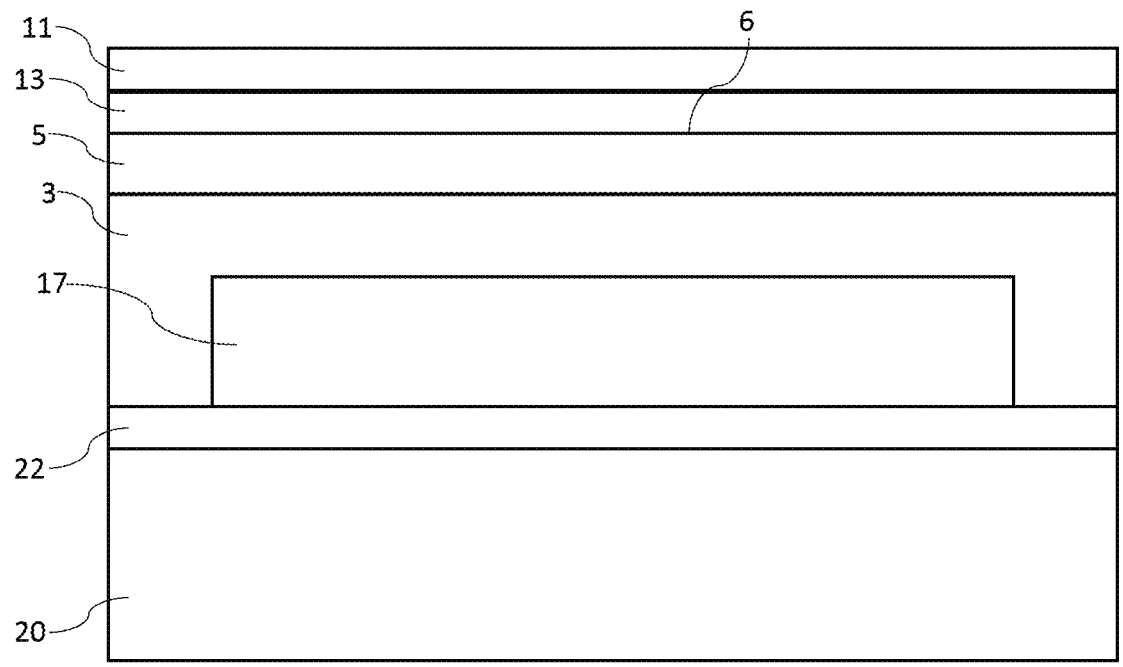
FIG. 5 shows the MEMS wafer after release of the first carrier substrate from the frontside.

With the MEMS wafer 1 attached to the second carrier substrate 20 via the thermal-release tape 22, the frontside 6 of the wafer is exposed to UV radiation, which cures an upper layer of adhesive in the UV-release tape 11 and releases the first carrier substrate 7. FIG. 5 shows the wafer assembly after release of the first carrier substrate 7. The MEMS wafer 1 is held by the second carrier substrate 20 attached to the backside while the peel tape 13 and cured UV-release tape 11 cover the MEMS layer 5 on the frontside. The peel tape 13 acts as a protective barrier for the underlying MEMS layer 5, thereby minimizing any contamination from silicone resins contained in the UV-release tape 11.

Figure 6:
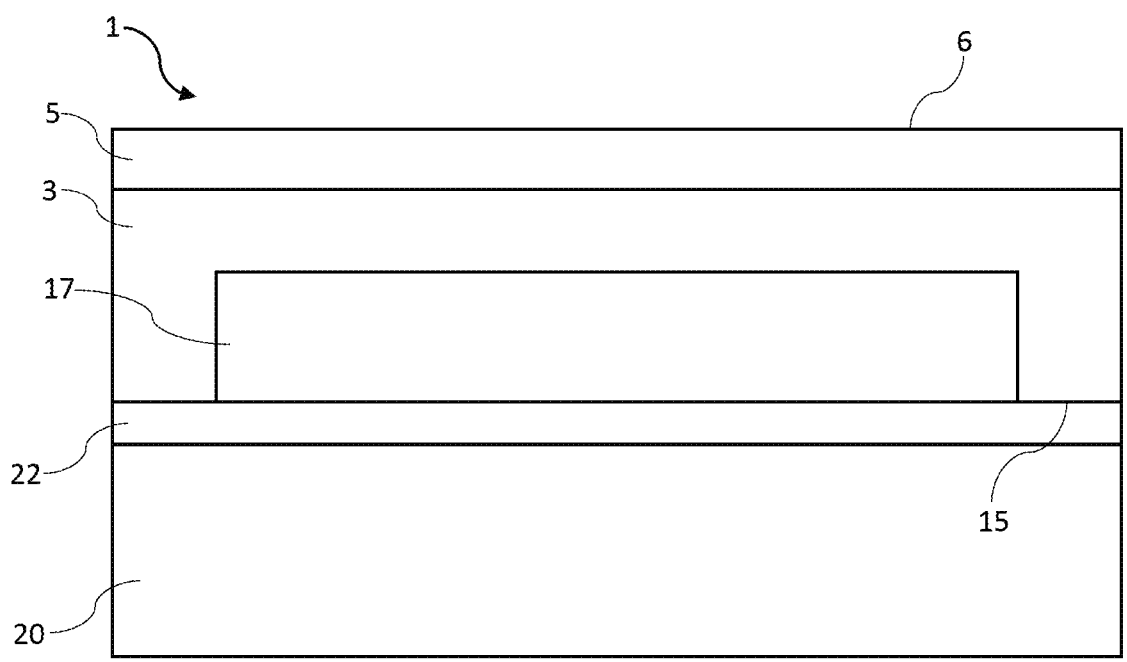
FIG. 6 shows the MEMS wafer after peeling away a peel tape from the frontside.

Referring to FIG. 6, the peel tape 13 is finally peeled away from the MEMS layer 5, with simultaneous removal of the UV-release tape 11 attached to the peel tape, to reveal the frontside surface 6. After removal of the peel tape 13 and UV-release tape 11, oxidative ashing (e.g. oxygen plasma ashing) may be used to clean any organic residues from the frontside surface 6, as well as remove any sacrificial resist inside MEMS structures (e.g. inkjet nozzle chambers). Since the peel tape 13 is absent any silicon, this ashing step provides a clean frontside surface 6 and MEMS devices free of any silica particles. Individual dies may be picked from the second carrier substrate 20 using a thermal-release process, as described in, for example, WO2008/141359.

From the foregoing, it will be appreciated that the wafer handling process described herein advantageously provides MEMS devices having minimal inorganic contaminants, such as silica particles. Accordingly, the process is highly suitable for handling MEMS wafers during fabrication of MEMS printheads chips having inkjet MEMS devices that are sensitive to such contaminants.

It will, of course, be appreciated that the present invention has been described by way of example only and that modifications of detail may be made within the scope of the invention, which is defined in the accompanying claims.

The invention claimed is:

1. A wafer assembly for use in a MEMS fabrication process, the wafer assembly comprising:
    a MEMS wafer comprising MEMS inkjet devices having inkjet nozzles on a frontside and an opposite backside;
    a peel tape releasably attached to the frontside of the wafer, the peel tape directly contacting the inkjet nozzles;
    a first wafer bonding tape attached to the peel tape; and
    a first carrier substrate releasably attached to the first wafer bonding tape,
wherein:
    the first wafer bonding tape comprises silicon;
    the peel tape is absent any silicon; and
    the resulting MEMS inkjet devices are absent any silica contaminants after removal of the peel tape and oxidative ashing.

2. The wafer assembly of claim 1, further comprising:
    a second wafer bonding tape attached to the backside of the wafer; and
    a second carrier substrate releasably attached to the second wafer bonding tape.

3. The wafer assembly of claim 2, wherein the second wafer bonding tape is different than the first wafer bonding tape.

4. The wafer assembly of claim 2, wherein the first and second wafer bonding tapes are selected from the group consisting of: UV-release tape and thermal-release tape.

* * * * *